United States Patent
Yang et al.

(10) Patent No.: US 7,464,010 B2
(45) Date of Patent: Dec. 9, 2008

(54) USER INTERFACE DESIGN AND EVALUATION SYSTEM AND HAND INTERACTION BASED USER INTERFACE DESIGN AND EVALUATION SYSTEM

(75) Inventors: Ung Yeon Yang, Daejeon (KR); Yong Wan Kim, Daejeon (KR); Wook Ho Son, Daejeon (KR); Hyun Bin Kim, Daejeon (KR)

(73) Assignee: Electronics And Telecommunications Research Institute, Daejeon (KR)

( * ) Notice: Subject to any disclaimer, the term of this patent is extended or adjusted under 35 U.S.C. 154(b) by 424 days.

(21) Appl. No.: 11/293,965

(22) Filed: Dec. 5, 2005

(65) Prior Publication Data

US 2006/0199167 A1      Sep. 7, 2006

(30) Foreign Application Priority Data

Dec. 21, 2004   (KR)   ............... 10-2004-0109294
Oct. 12, 2005   (KR)   ............... 10-2005-0096230

(51) Int. Cl.
*G06F 3/11*   (2006.01)
*G06F 11/34*  (2006.01)
*G06F 9/06*   (2006.01)

(52) U.S. Cl. ............... 703/2; 703/1; 703/21; 703/24; 345/163; 345/474

(58) Field of Classification Search ............ 703/1, 703/21, 2, 24; 345/474, 163; 380/201
See application file for complete search history.

(56) References Cited

U.S. PATENT DOCUMENTS

2002/0030664 A1*  3/2002  Schena et al. ............... 345/163
2002/0042703 A1   4/2002  Furusu et al.
2004/0236541 A1* 11/2004  Kramer et al. ............... 703/1
2006/0087510 A1*  4/2006  Adamo-Villani et al. .... 345/474
2007/0053513 A1*  3/2007  Hoffberg ..................... 380/201

FOREIGN PATENT DOCUMENTS

| JP | 6332686 | 12/1994 |
| JP | 7056670 | 3/1995 |
| JP | 7140889 | 6/1995 |
| JP | 8101737 | 4/1996 |
| JP | 8241191 | 9/1996 |
| JP | 2002-123409 | 4/2002 |
| JP | 2002-229718 | 8/2002 |
| KR | 10 0351709 | 8/2002 |
| KR | 10 0390361 | 6/2003 |

* cited by examiner

*Primary Examiner*—Thai Phan
(74) *Attorney, Agent, or Firm*—Ladas & Parry LLP

(57) ABSTRACT

A user interface design and evaluation system and a hand-interaction-based user interface design and evaluation system are provided. The user interface design and evaluation system includes: a user interface design unit, a human model interaction design unit, a user interface prototype simulation unit, a human model simulation unit, and a user interface evaluation unit. In order to develop a user interface in consideration of usability of a user, the system provides a usability evaluation feedback system performing optimization of an interface design based on a motion simulation of a body model and user interface model. Through this, an optimum interface design is derived and by reducing the initial usage difficulty of the new interface for a user, the user can easily use the new interface and work performance of the user can be enhanced. In addition, by supporting fast prototyping and evaluation in a new product development stage, efficient production of a product having a short life cycle can be actively implemented.

14 Claims, 5 Drawing Sheets

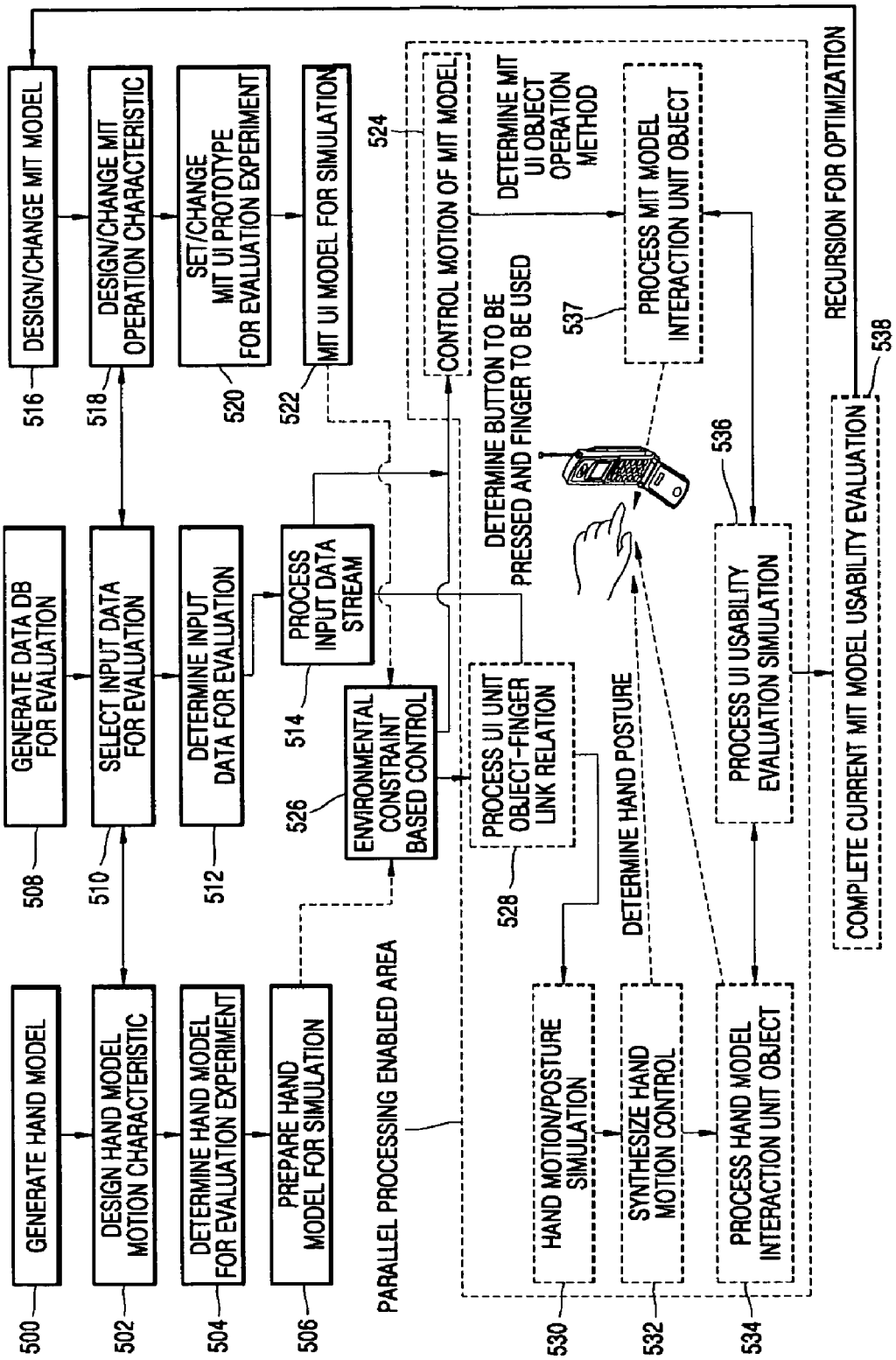

USER INTERFACE DESIGN AND EVALUATION SYSTEM AND HAND INTERACTION BASED USER INTERFACE DESIGN AND EVALUATION SYSTEM

CROSS-REFERENCE TO RELATED PATENT APPLICATIONS

This application claims the benefit of Korean Patent Application No. 10-2004-0109294, filed on Dec. 21, 2004, and 10-2005-0096230, filed on Oct. 12, 2005, in the Korean Intellectual Property Office, the disclosure of which is incorporated herein in its entirety by reference.

BACKGROUND OF THE INVENTION

1. Field of the Invention

The present invention relates to a user interface, and more particularly, to a system capable of designing and evaluating a user interface.

2. Description of the Related Art

A user interface development field to which the present invention belongs is a part of research and development of man-machine-interface (MMI) and human-computer-interaction (HCI).

Previously, in designing a user interface, the design had been performed focusing on the result of jobs and enhancement of the job function of a machine. However, the recent design technology trend is showing a shifted focus on enhancement of the entire job efficiency of a system, by considering elements (for example, a worker) other than the machine function.

In addition, the fixed type of user interface system in which the user interface is achieved through physical interaction of a user is moving toward a more flexible type capable of suiting specific requirements of a user, in the form of a virtual environment based interaction system, using a variety of input and output apparatuses with a multi-modal interface, and a virtual interface.

In an engineering aspect, in the technology field to establish a standardized process of a user interface design and evaluation method, a system to obtain objective usability evaluation data by utilizing a group of experimentees has been introduced in the past stage where a user interface was designed and evaluated one-sidedly based on the knowledge of past experts.

Nowadays, the experiment methodology and statistical analysis methodology to improve the objective reliability of the process described above are being researched, and it is expected that technology development will be made in a direction to increase the efficiency of a usability evaluation system based on an automation system, such as artificial intelligence-based expert systems, in the future.

With regard to the contents related to conventional evaluation of keyboard design, the trend of keyboard design applications is applying research results considering ergonomic elements, but not enough models for substantially evaluating them afterwards are provided.

The technologies for user interface design and simulation are in a state where a physical manufacturing stage is being optimized, by introducing computer added design/computer added manufacturing/computer added engineering (CAD/CAM/CAE) systems using a computer, moving from the past system repeating a process of design focused on a 2-dimensional diagram and evaluation using prototype manufacturing. Also, technologies for establishing a more efficient production system by combining a multi-modal interface technology are being researched.

In the technologies for interaction design and simulation using a human model, a technology for external shape modeling has been developed to a level capable of showing a virtual actor in a film. However, a virtual human expression technology, which replaces the appearance of an actor in real time in an online connection, is only at a level to suit game contents, and has a limitation in realistic expression. Also, an artificial intelligence technology for operation of an independent object, or a simulation technology to simulate the internal movement of a virtual human body has been developed to just a partial implementation level.

In case of the technologies related to a mobile information terminal (a handphone) that is an example application field to which the present invention to be explained below is applied, due to the various requirements of the market and the shortened life cycle of the product, auxiliary systems for changing a design with a feedback considering the usability of actual users even from the design stage of a product have been under development. However, when a feedback model obtained from a group of a limited number of experimentees is used, the evaluation result intrinsically has a predetermined limitation of reliability. Also, since the technologies have been developed with a purpose of product function oriented designs, there is a limitation in standardizing and automation of the variety of the physical interaction conditions of users and applying the result to development of products.

So far, most of research of a new interface apparatus has been about the operation principle of the apparatus. However, recently, experimentee test methodology of industrial engineering has been systematically applied, and the research to enhance the completeness of an evaluation process has been also emphasized. That is, as an answer to a question, "How can it be proved that the user interface (UI) system is really useful?" is obtained, the recent trend in the human computer interaction (HCI) related research field shows that only results of research systematically and objectively proved with introduction of infrastructure technologies in relation to a new apparatus development have been admitted. However, since the current evaluation experiment methodology requiring persons causes a big burden economically and in time, an experiment methodology minimizing this burden is being researched, but this burden has been the obstacle to fast UI research and development of new apparatuses.

The previous patent applications in relation to technologies for evaluating a user interface can be briefed as the following.

In case of a user interface evaluation apparatus laid open for a Japanese patent (Japanese Patent Laid-open Publication No. 1996-101737), a method by which when a usability evaluation experiment of a consumer electronics and/or office automation product is performed, information collected during the experiment is used and managed through an automated system, and analyzed in graphics is disclosed. However, the apparatus is just enhancing the efficiency of a process of an experimentee test.

In case of a GUI automatic evaluation apparatus (Japanese Patent Laid-open Publication No. 1996-241191) and a GUI evaluation system, a GUI evaluation method thereof, and a recording medium storing a GUI evaluation program (Japanese patent Laid-open Publication No. 2002-123409), the apparatus evaluates whether or not a GUI that is a graphic based user interface is designed according to a design guide so that the function of the designed product can be fully performed, and performs evaluation of the design function step by step. Accordingly, there is a limitation in utilizing the apparatus in evaluation of usability in consideration of user's participation.

The previous patent applications in relation to technologies for developing a new user interface can be briefed as the following.

In case of a virtual keyboard and a method for determining a touch position of a virtual keyboard (Japanese Patent Laid-open Publication No. 2002-220718), a technology to implement an input apparatus supporting a virtual keyboard input job by mapping a virtual keyboard on a touch panel is disclosed. Accordingly, there is a limitation in applying it to design of an input apparatus considering a variety of shapes (for example, a layout) other than a plane shape and usage conditions.

In case of a user interface movement technology method and a user interface apparatus, a software evaluation method and software authoring method using the same (Japanese Patent Laid-open Publication No. 1994-332686), disclosed is a method by which a user interface is designed in a state transition diagram and by using the diagram, software is evaluated and authored. This is a design and evaluation method focusing on a user interface and implementation of functions of software to which the user interface is applied.

In case of an individual-adaptive information processing interface (Japanese Patent Laid-open Publication No. 1995-056670), a method considering the physical and cognitive characteristics of a user is disclosed. According to the user interface implementation method, a pace that a user learns an interface apparatus is learned and the user interface is adapted to the pace.

The previous patent applications using physical motion simulation technologies as the contents of the present invention can be briefed as the following.

In case of a human body simulation experiment apparatus (Japanese Patent Laid-open Publication No. 1995-140889), the impact of an external action to a human body is collected through a variety of sensors installed inside a human body model (dummy) and a passive interaction relation of the human body to a given environment is simulated. The human body model is utilized in the field of design evaluation focusing on a large-scale interface such as a vehicle and a factory instrument board, but applications to detailed jobs, such as small-sized consumer electronics and information terminal apparatuses, are insufficient.

Also, in case of a method and system for analyzing behavior of whole human body by simulation using whole human body model (the U.S. Patent Laid-open No. 20020042703), a system related technology to simulate dynamic physical change of a user is disclosed. However, the object of the technology is passive motion change situations as an external force as in a car accident is applied. Also, the application field is evaluation of industrial and/or large-sized machines.

Researches for development of a user interface with a variety of purpose, such as improvement of job performance and user convenience, can be briefed as the following.

In the field of a keyboard input apparatus, methods for improving input performance by changing layouts of a keyboard, such as a 3set keyboard layout design (for example, a Korean keyboard system (Korean Patent No. 0390361), and a mobile terminal having a 3-set keyboard layout (Korean Patent Laying-open No. 2002-0038185)) have been suggested. However, in many cases results obtained from a small-sized group of experimentees that has a lower objective reliability have been suggested. Also, object data in relation to evaluation of relative excellency with respect to a variety of keyboard layouts is not enough.

Among research fields related to a hand simulation technology that is mainly addressed in the present invention among human body simulations, a human body simulation technology has been researched in a kinematics aspect in the traditional robot engineering field. In the virtual reality field studying haptic interface, simulation research for calculating a precise force applied to a human body (hand) model in contact with an arbitrary virtual object has been conducted.

In case of goals, operators, methods, and selection rules (GOMS) that is one of user interface evaluation methods, a process of using an interface is described by stages, and human resources required in each stage are set in measure units, such as time. Then, the performance of a predetermined interface apparatus with respect to an arbitrary input value is simulated and/or evaluated. However, this model has a limitation that the model generalizes the diversity of a user part. Accordingly, when a variety of relations appearing by combining the variety of a predetermined interface apparatus and the personal characteristic (human body information) of a user are simulated, this model has a limitation.

Therefore, a proper method of providing and evaluating a user interface in a variety of environments has not been suggested by any of the conventional technologies.

SUMMARY OF THE INVENTION

The present invention provides a user interface design and evaluation method and a hand interaction based user interface design and evaluation method.

According to an aspect of the present invention, there is provided a user interface design and evaluation system based on interaction, including: a user interface design unit designing a user interface object and a user interface, and providing a motion property to each unit object; a user interface prototype simulation unit managing interaction information to be exchanged by an internal object of the user interface with the outside, and information related to usability evaluation, and performing simulation of the designed use interface; a human model design unit designing a human model in relation to a human body to be evaluated for user interface usability, and authoring a motion characteristic model of the designed human model; a human model simulation unit managing information at a time when the human model interacts with the user interface object, and performing simulation; and a user interface usability evaluation unit managing contents-based input data that are the contents of a usability evaluation experiment using the generated user interface model and human model, and by using the simulated result of the user interface prototype and the simulated result of the human model, performing a usability evaluation experiment of the user interface prototype in relation to the human model and evaluating the usability of the designed user interface model.

The user interface design unit may support design of an interface object, and by using an available input and output interface tool, may design a 2-dimensional and/or 3-dimensional user interface and provide a motion property to each of unit objects.

The user interface design unit may simulate the motion of a designed user interface according to a predetermined method, and verifies a designed model.

The user interface prototype simulation unit may modify shape information that is physical data of a user interface design; manage interaction information to be exchanged by the internal object of the user interface with the outside, when an external object, including a human body, interacts with a user interface element object; set initial values of the interface in relation to usability evaluation; provide reference information for changing the structure of the interface by receiving predetermined feedback data; update evaluation elements of internal elements of the interface; and perform simulation by linking model data defined in the user interface design unit, the user interface shape information, the user interface interaction information, and the usability evaluation information of the user interface.

The human model design unit may support design of a basic human body model of a human being by forming and displaying a human body with using graphic data; design a human body model for a user interface usability evaluation experiment; author a motion characteristic model of the human body model designed according to a human body anatomy and a movement analysis theory; and simulate the motion of the designed human body model and verifies the designed model, by using motion data of a normal human body, or using motion data of a state in which predetermined constraints are added, or generating arbitrary motion data.

The human model simulation unit may change, when necessary, the shape information of the human body model whose design is completed; when interaction with a user interface object is performed, author information which is to be received by the human body model and elements affecting a corresponding object; set initial values of the human body model in relation to usability evaluation; update internal parameters of a human body simulation model by receiving predetermined feedback data; and perform simulation by linking model data defined in the human model design unit with human model shape information, human model interaction information and the human model usability evaluation information.

The user interface usability evaluation unit may manage contents-based input data that are the contents of a usability evaluation experiment using the generated user interface model and human model; divide the data selected from the input data into units appropriate to a usability evaluation experiment operation, and provides the divided data to the user interface prototype simulation unit; evaluate usability, by processing a usability evaluation experiment using predetermined input data, the simulation result of the user interface prototype simulation unit, and the simulation result of the human model simulation unit; and set relations for exchanging interaction information designed in each simulation unit.

The user interface usability evaluation unit may output to a user, the result of an optimum user interface design in relation to the human body model obtained by processing the resulting values of the evaluation result; and together with the optimized user interface design result, output moving pictures of a situation in which the user interface is used by the body model.

The user interface prototype simulation unit may exchange predetermined feedback data information with the user interface usability evaluation unit.

The human model simulation unit may exchange predetermined feedback data information with the user interface usability evaluation unit.

According to another aspect of the present invention, there is provided a user interface design and evaluation system based on hand interaction, including: a hand model preparation unit designing human body anatomical parameters that are measuring criteria of a usability evaluation experiment, parameters related to an ergonomic analysis, internal constraints and external constraints, and providing motion characteristics to the shape of a designed model; an input data preparation unit for evaluation experiment managing a database for evaluating usability of a user interface, and providing input data to be used in usability evaluation simulation, from the database; a model preparation unit designing the external shape of an interface performing direct interaction with a user, and when an interaction with a user interface unit object by using the hand is performed, defining interaction information to be exchanged between two objects, changing the motion property value of the interface, and updating evaluation elements of the internal element of the interface; and a usability evaluation simulation unit performing usability evaluation, including hand model and user interface simulation results, by using the resulting data from these units, and obtaining an optimum user interface design result.

The system may further include a unit comparing the usability evaluation result of the usability evaluation simulation unit with a predetermined reference value, wherein if the usability evaluation result is not greater than the reference value in the comparison unit, the usability evaluation result is transferred to the model preparation unit and the external shape of the user interface is designed again.

The input data preparation unit for evaluation experiment may manage a database appropriate to a purpose of evaluating usability of a user interface, focused on a predetermined utilization scenario; generate input information items by a method for selecting input data appropriate to an evaluation simulation from the database, or a method for generating a random numbers; and provide the input data after dividing and/or combining input data so that the input data corresponds to a minimum interaction unit of a human model and a user interface model to be used in the usability evaluation simulation.

The model preparation unit may design the external shape of the interface directly performing an interaction with the user; allow the property of the designed model in relation to an interaction unit object to be changed in a multi-dimensional area, including spatial and temporal properties, according to an object based design method; define the motion property of an interaction object, focusing on input and output; set shape information matching with a predetermined experiment criterion; define interaction information to be exchanged between objects when an interaction with a user interface unit object by using the hand is performed; set the initial values of an interface related to user interface usability evaluation; change interface motion property values; and update evaluation elements of internal elements of the interface.

BRIEF DESCRIPTION OF THE DRAWINGS

The above and other features and advantages of the present invention will become more apparent by describing in detail exemplary embodiments thereof with reference to the attached drawings in which:

FIG. 5 is a flowchart of an example of design and evaluation of a user interface of a mobile terminal according to the present invention.

DETAILED DESCRIPTION OF THE INVENTION

Terms to be used in the description of the present invention will be defined in advance as the following:
CAD: computer added design. Design using a computer.
GUI: graphic user interface. Focusing on 2-dimensional interactions.
HCI: human computer interface.
HM: human model. Human body mode, human-being model.
IEA: information electronic appliance.
MIT: mobile information terminal. A mobile information terminal, such as a PDA and a hand-phone, and a mobile information device.
MMI: man machine interaction.
UI: user interface.
VUI: virtual user interface.
HMD: head/helmet mounted display. A display apparatus worn on the head.

The present invention will now be described more fully with reference to the accompanying drawings, in which exemplary embodiments of the invention are shown.

Figure 1:
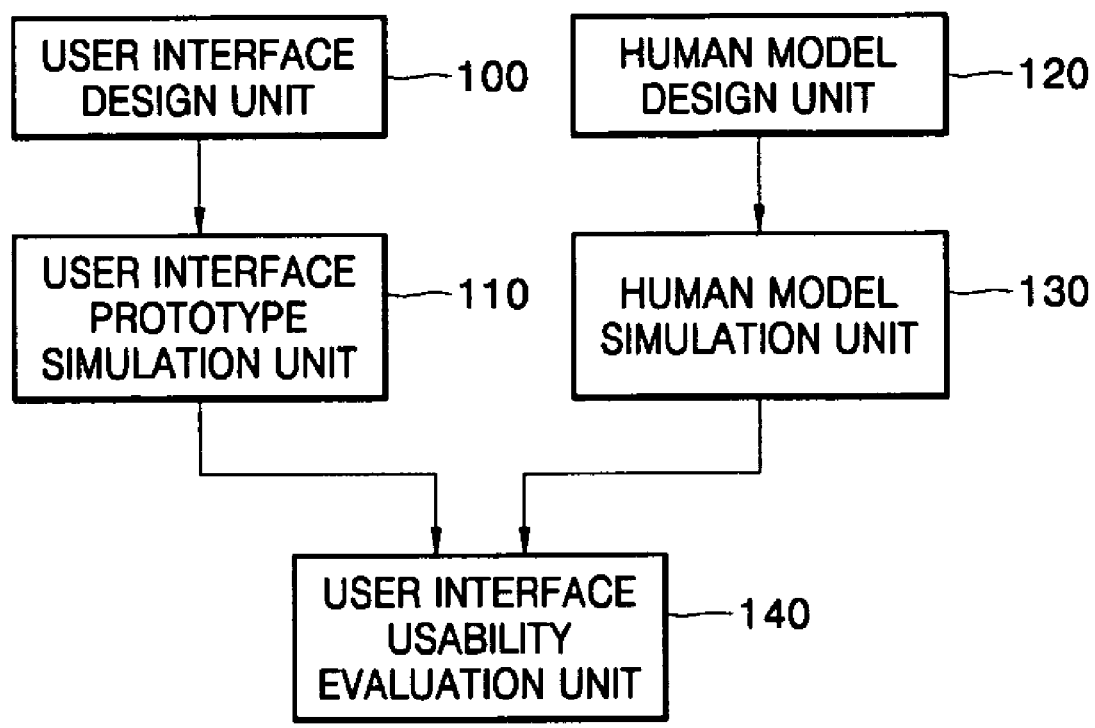
FIG. 1 is a block diagram of the structure of a user interface design and evaluation system according to the present invention.

FIG. 1 is a block diagram of the structure of a user interface design and evaluation system according to the present invention.

The system supporting design and evaluation of a user interface includes a user interface design unit 100 for designing a user interface by using a CAD system related technology based on an ordinary 2-dimensional environment or based on a 3-dimensional virtual environment, and a human model design unit 120 for designing a human model by generating major simulation objects. The system also includes a user interface prototype simulation unit 110 and a human model simulation unit 130 configured so that detailed parameters of a user interface designed in the user interface design unit 100 and a human model can be adjusted and an independent test can be performed before a usability evaluation simulation. Finally, the system includes a user interface usability evaluation unit 140 performing a usability evaluation simulation so that an optimum user interface design value can be obtained based on input data given by utilizing the functions of the two previous simulation units 110 and 130.

The user interface design unit 100, the user interface prototype simulation unit 110, the human model design unit 120, and the human model simulation unit 130 correspond to preparation processes for the operation of the user interface usability evaluation unit 140 and can be implemented easily by using the current CAD/CAM/CAE related technologies, virtual human body modeling, and animation technologies, and the usability evaluation technologies in the industrial engineering field.

Figure 2:
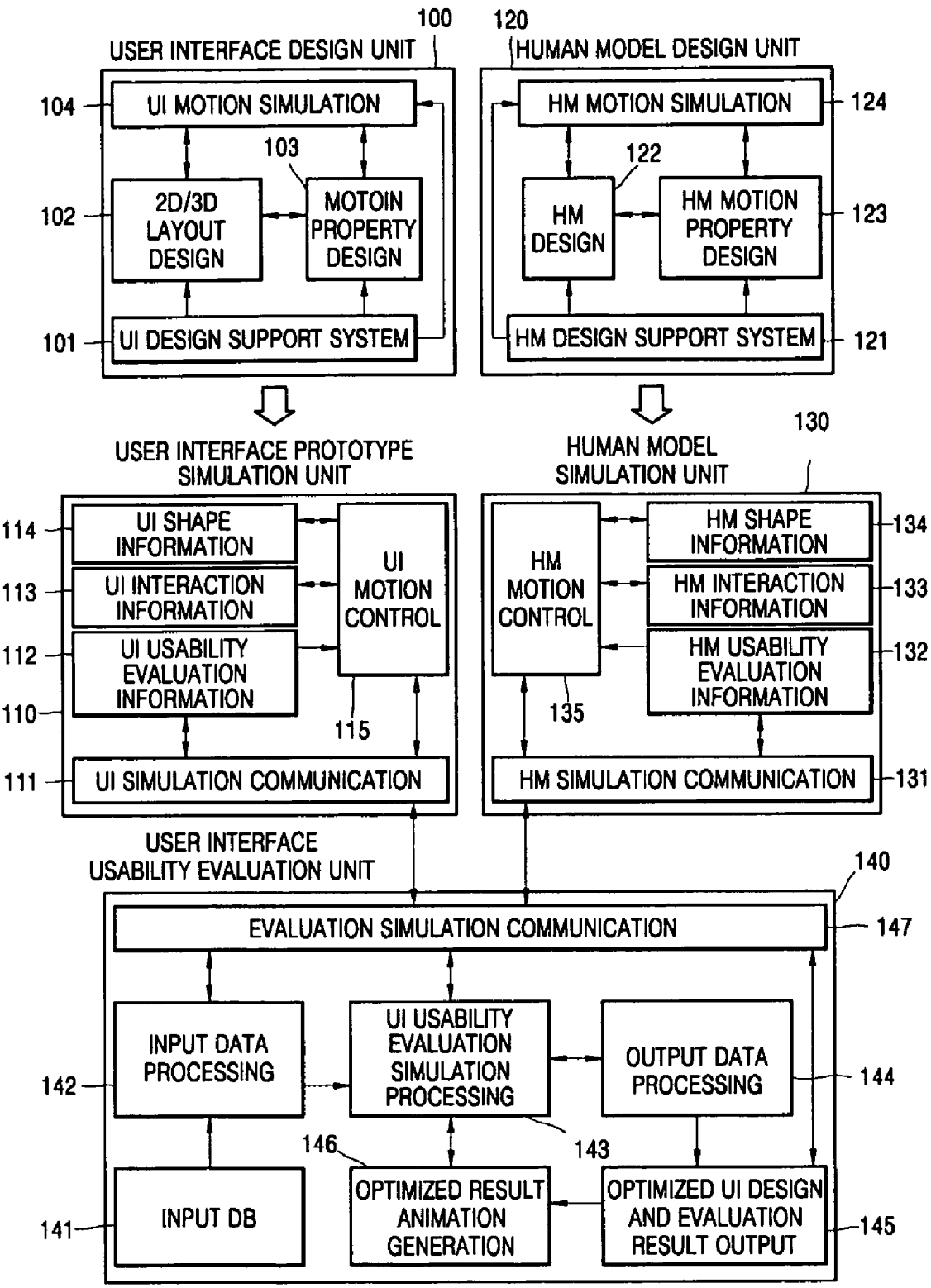
FIG. 2 is a detailed block diagram of the structure of a user interface design and evaluation system of FIG. 1 according to the present invention.

FIG. 2 is a detailed block diagram of the structure of a user interface design and evaluation system of FIG. 1 according to the present invention.

The user interface (UI) design unit 100 designs a user interface with focusing on the purpose and/or function of the user interface.

A UI design support system 101 is a unit supporting a basic interface object design such as an ordinary 3-dimensional CAD program. A 2D/3D layout design unit 102 is a unit for designing a user interface in a 2D and/or 3D format, by using a variety of current input output interface apparatuses, such as a mouse interface apparatus of a 2-dimensional desktop computer environment, a HMD of a 3-dimensional virtual reality environment and a 3-dimensional mouse apparatus.

A motion property design unit 103 is a unit for providing a motion property to each unit object. The motion property design unit 103 sets the motion property of each of the element units of a user interface, such as an 'action property' used in a CAD tool, including the movement direction of a element part and a rotation axis, expresses the property as sub-level units formed with an input part, a processing part, and/or an output part, and designs a flowchart that shows a motion structure of the user interface with a state diagram. A UI motion simulation unit 104 is a part for simulating the motion of a designed user interface prototype in an environment such as a CAD/CAE tool, and verifying the designed model.

The UI prototype simulation unit 110 authors the interaction relation of a user as a representative, with an external object, for example, that in a situation where a button in a keyboard is pressed by a finger of the user, and supports simulation of the relation. The UI prototype simulation unit 110 also authors and supports simulation of interaction relations between element units of a user interface apparatus, for example, that in a situation where part 2 is moved by force of part 1 as a mechanical motion.

A UI shape information unit 114 is a unit for modifying physical data that is shape information of a user interface design, for example, elements expressing physical amounts of a part in a CAD system, the size of an external shape, weight, and changes in an intensity value with respect to materials. A UI interaction information unit 113 loads, stores, changes and manages interaction information that an inside object of a user interface should exchange with the outside, for example, interaction information such as the occurring degree of impact and/or fatigue, durability and/or fatigue value of a part as a parameter applied when a dynamic simulation is performed as in a CAE tool, and the value of force of a part acting on another object in contact with the part.

A UI usability evaluation information unit 112 sets initial values of an interface in relation to usability evaluation, for example, the position of an object, such as an interface button, and scores reflecting selection of a specific design type and preference of consumers in relation to the design type. By receiving feedback data of the user interface usability evaluation unit 140, the UI usability evaluation information unit 112 suggests reference information for changing the structure of an interface, for example, slight modification of the intensity of pressure applied to a button, change of durability of button pressure, and change of the position of a button. The UI usability evaluation information unit 112 also updates evaluation elements of internal elements of an interface, for example, by changing of a score distribution ratio with respect to change of the position of a button from the viewpoint of design evaluation.

At this time, for a usability test using the initial values described above, such as the position of an object, such as an interface button, and scores reflecting selection of a specific design type and preference of consumers in relation to the design type, parameters of a user interface that is a current product is set and changed.

The feedback data of the user interface usability evaluation unit 140 is evaluation information in relation to values set by the UI usability evaluation information unit 112.

A UI motion control unit 115 performs simulation by linking model data defined in the user interface design unit 100 with information from the UI shape information unit 114, the UI interaction information unit 113, and the UI usability evaluation information unit 112. That is, since the model data defined in the user interface design unit 100 is generated by a parameter-based modeling technique, the prototype simulation (for example, manipulation of a 3-dimensional model performed on a computer) of a variety of elements forming the model is performed by using values changed through the UI shape information unit 114, the UI interaction information unit 113, and the UI usability evaluation information unit 112.

A UI simulation communication unit 111 provides a function for processing information exchange between the user interface prototype simulation unit 110 and the user interface usability evaluation unit 140.

The human model design unit 120 performs design and/or change, focusing on a human body part that is mainly used in the physical interactions with a user interface. For example, in case of development of a user interface for a mobile information terminal that is an embodiment of the present invention, the part that is mainly used in the interaction that is an action of using the device is the hand. Accordingly, design of a human model and change of templates that are 3-dimensional models generated in advance and stored in the form of a database are performed focusing on the hand. In order to measure fatigue from using the interface, an arm model or a shoulder model is included or in order to simulate measuring of a job performance, a head model to add a view vector element is included in the jobs according to the present invention.

The structure of a human body model may include a 3-dimensional polygon mesh corresponding to skin as an external element for 3-dimensional visualization, bone structures for controlling operations, such as generation of manipulation animation, and anatomically more detailed muscle and tendon structures between bones for a usability evaluation simulation.

An HM design support system, 121 is a part to support design of a basic human body model of a human being, by utilizing 3-dimensional graphic technologies. For example, design of a human body model having a variety of characteristics is supported based on a database and/or template system. The function of the HM design support system can be implemented by using a software development kit (SDK) provided by current commercial tools, such as Maya, 3D studio Max, and Poser, or a 3-dimensional computer graphics method.

An HM design unit 122 is a part for designing a human model appropriate to a user interface usability evaluation experiment by utilizing information of the HM design support system as an ordinary commercial tools for designing a virtual human. For example, when a usability evaluation of a handphone manipulation scenario using both hands is performed, only hand parts are generated by using commercial modeling units. For example, by using representative commercial programs like 3D Studio MAX or Maya, hand model of a human body can be modeled. It is obvious that these general purpose programs can be used without change or by using programming libraries of software development kits (SDK) provided by the general purpose programs, new functions according to the present invention can be added to the basic functions provided by commercial programs.

According to the present invention, a simulation of a human model is performed with respect to the interaction with a user interface through physical movements, including biological activities. Accordingly, an HM motion property design unit 123 is a part for authoring a motion characteristic model of a human body model, which is designed as described above, based on knowledge on the anatomy of a human body. The meaning of the motion property here indicates applying of a movement anatomy theory. For example, in relation to a model of a hand formed with bones, muscles, and tendons, it is impossible to define all hand shapes with a simple connection structure of multiple joints. Accordingly, the motion property means that the hand model has the motion property of a motion of a predetermined joint acting on other joints connected to the joint.

An HM motion simulation unit 124 is a part for simulating the motion of a designed human model and verifying the designed model, by using normal human motion data obtained through a motion capture apparatus, such as a 3-dimensional computer animation authoring tool, or motion data obtained through a real-time motion tracking apparatus, or by using motion data to which predetermined constraints, such as a constraint on a motion range, are added, or by generating arbitrary motion data.

The structure and operation of the HM simulation unit 130 will now be explained.

An HM shape information unit 134 is a part for changing physical numbers determining the external shape of an HM that is shape information of a human model whose design is completed, according to the necessity of an experiment. An HM interaction information unit 133 is a part for authoring information items, including information which a human model receives when a human model interacts with an individual user interface, for example, an element affecting to the other side, such as a fatigue degree that a human body including the hand will get, and updated information of the number of the fatigue degree that an object part of the human model will get from the other side. The HM shape information unit 134 also takes charge of real-time update when it is interoperating with the user interface usability evaluation unit 140.

An HM usability evaluation information unit 132 is a part for setting an initial value of a human model in relation to usability evaluation, for example, initial values of the preference tendency of a predetermined design, and the preference degree and/or fatigue degree of a predetermined motion, and updating internal parameters of a human simulation model by receiving feedback data of the user interface usability evaluation unit 140. For example, parameters in relation to action of a force from outside a human body due to the use of a user interface, and an accumulated with respect to the force, are updated.

The feedback data of the user interface usability evaluation unit 140 is the same as described above.

Like a character control engine software program for 3-dimensional computer graphic animation or online games, or a biomechanical simulation program, such as LS-DYNA, an HM motion control unit 135 is a part for performing simulation by linking model data defined in the human model design unit 120 with information output from the HM shape information unit 134, the HM interaction information unit 133, and the HM usability evaluation information unit 132.

An HM simulation communication unit 131 performs information exchange between the human model simulation unit 130 and the user interface usability evaluation unit 140.

As described above, it is clear to a skilled person in the art of the present invention that the user interface design unit 100, the user interface prototype simulation unit 110, the human model design unit 120, and the human model simulation unit 130 can be implemented as software programs by using technologies in their respective fields such as computer engineering, ergonomics, and industrial engineering, and libraries for development provided by conventional commercial programs.

The structure and operation of the user interface usability evaluation unit 140 will now be explained.

An input DB 141 is a part for managing input data based on contents of a usability evaluation experiment using a user interface model and a user model (human model). An input data processing unit 142 is a part for dividing data selected in the input DB 141, into units appropriate to a usability evaluation experiment stage and providing the data to an input end of a usability evaluation simulation.

A UI usability evaluation simulation processing unit 143 is a part for processing a usability evaluation experiment, by using the input data, the user interface prototype simulation unit 110, and the human model simulation unit 130, and sets relations for exchanging interaction information designed in each simulation unit 110 and 130. For example, by setting the relation between a predetermined button of a user interface and a predetermined finger of a user hand model, information on a minimum amount of an external force for an operation of the predetermined button is transferred to a finger processing unit (not shown) included in the UI usability evaluation simulation processing unit 143 and the degree of transfer of an impact occurred by a motion of a button is transferred. At the same time, the finger processing unit transfers the magnitude of a force acting on a UI unit in contact with the finger processing unit, to the UI unit, and can receive the amount of impact absorption accommodated by the UI unit.

An output data processing unit 144 is a part for processing a result value of the evaluation result. An optimized UI design and evaluation result output unit 145 outputs an optimum user interface design result in relation to the human body model and input data given through the UI usability evaluation simulation processing unit 143 described above.

In relation to the UI usability evaluation, a unit experiment (type A) for obtaining an optimum value by determining a predetermined product designed by a UI designer, a human body model (for example, a hand model) to be used for usability evaluation, and input contents to be used for evaluation, can be performed as an evaluation experiment. If the evaluation score of the type A experiment is determined by performing interoperation of the human body model simulation, the UI simulation, and the input data processing unit 142 as described above, the simulation performer can determine a threshold in advance and based on the threshold, determine whether to perform additionally a different experiment (type B) or to accept the result of the type A experiment result that is the current design setting state and apply the result to production. Through this process, the optimum user interface design result in relation to the human body model and input data can be determined.

An optimum result animation generation unit 146 generates an optimized UI design result, and an animation showing that the UI is used with the given human body model. By applying parameters determined based on the information obtained from the optimized UI design and evaluation result output unit 145, a real-time 3-dimensional image is generated in the user interface prototype simulation 16. unit 110 and the human model simulation unit 130, or the 3-dimensional image is recorded in a video format and then is output.

For the data communication described above, the user interface usability evaluation unit 140 is connected to the user interface prototype simulation unit 110 and the human model simulation unit 130 through an evaluation simulation communication unit 147.

When the influence relations of interactions between internal and external elements of the model of each part are set in order to support the operations according to the present invention as described above, the products that the present invention considers may include real objects such as design of a driver's seat inside a car or design of an interface unit of an information terminal, or a virtual object, such as a 3-dimensional menu demonstrated in a virtual space in an HMD based virtual reality system. Accordingly, the design units 100 and 120 and the simulation units 110 and 130 record data by distinguishing a real object and a virtual object, and support data exchange for each case.

The reason why the user interface design unit 100 and the user interface prototype simulation unit 110 have structures identical to those of the human model design unit 120 and the human model simulation unit 130, respectively, is that the hand, which is the interaction interface of a human being is an interface whose basic design has been finished to fit the way of thinking and behavior of the human being, through the long-time evolution process. A structure similar to the structure described above can be designed in order to accommodate a variety of changing conditions from the user's point of view, as in case of a disabled person who has restrictions in movement of a predetermined part of his physical body.

Figure 3:
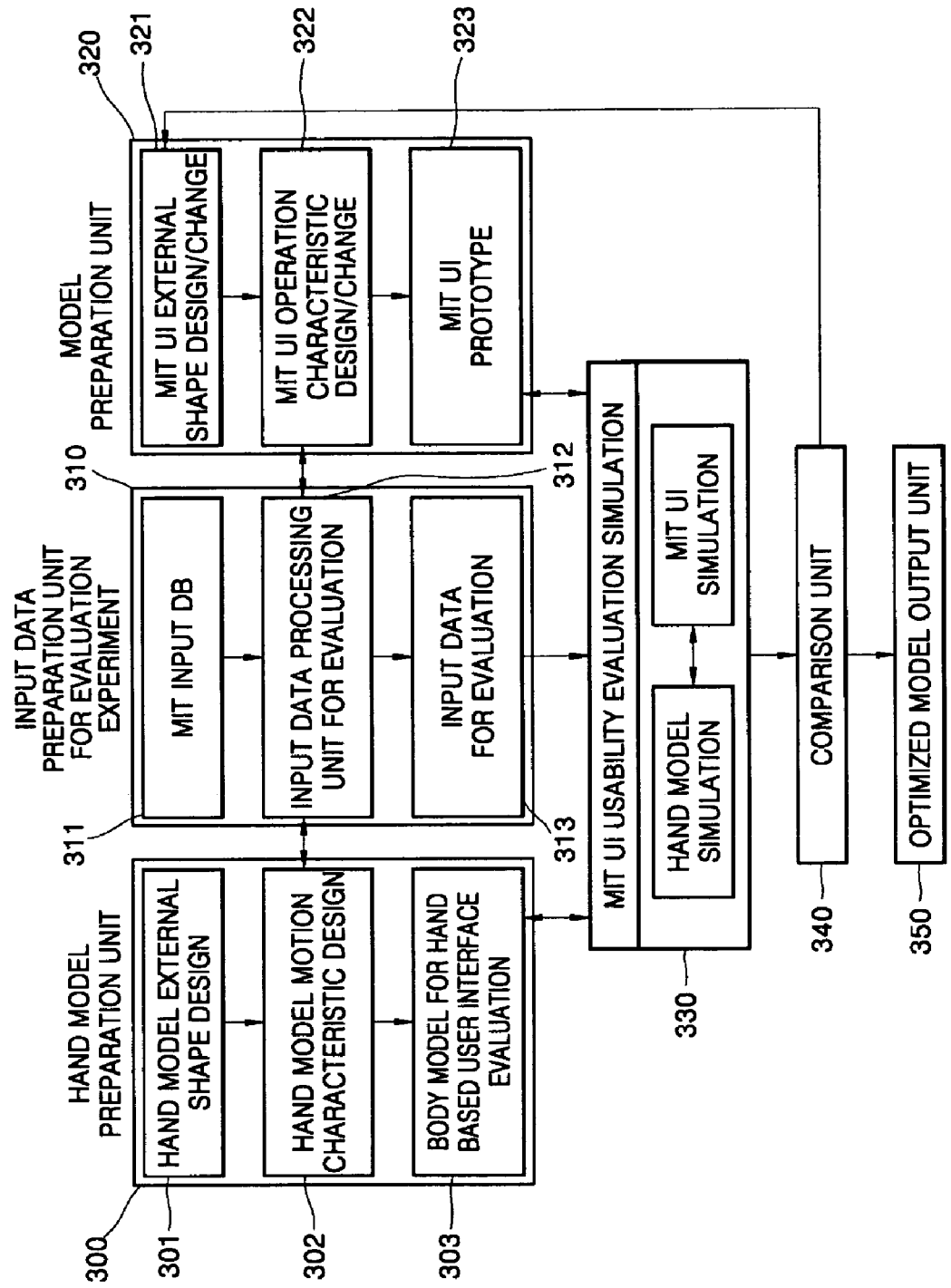
FIG. 3 is a block diagram of the structure of a hand interaction based user interface design and evaluation system according to the present invention.

FIG. 3 is a block diagram of another example of the structure of a hand interaction based user interface design and evaluation system according to the present invention. The structure of FIG. 3 is an example of a specific system implementation of the structure of FIG. 2.

For example, this system for designing and evaluating a hand interaction based user interface, such as a handphone use interface, includes a hand model preparation unit 300, an input data preparation unit for evaluation experiment 310, a model preparation unit 320, a usability evaluation simulation unit 330, a comparison unit 340, and an optimized model output unit 350.

The hand model preparation unit 300 designs human body anatomy parameters that will be criteria of measuring a usability evaluation experiment (corresponding to the HM design unit 122), designs parameters related to ergonomic analysis (corresponding to the HM usability evaluation information unit 132), designs internal constraints (corresponding to the HM motion property design unit 123), and designs external constraints (corresponding to the HM interaction information unit 133), and by doing so, provides motion properties to the designed shape of the model.

The input data preparation unit for evaluation experiment 310 manages a database appropriate to the purpose of evaluating the usability of a user interface, according to the interface utilization method described above with reference to FIG. 2 (corresponding to the input DB 141), selects input data appropriate to the evaluation simulation from the database or generates input information items by a method including generation of random numbers (corresponding to the input DB 141), and provides input data, after dividing the input data to fit the minimum interaction unit of the human body model and the user interface model in the usability evaluation simulation, or combining the input data (corresponding to the input data processing unit 142).

The model preparation unit 320 designs the external shape of an interface performing direct interaction with a user (this function corresponding to the UI design support system 101 and the 2D/3D layout design unit 102), allows the properties of the interaction unit object of the design model to be changed in a multi-dimensional area including spatial and temporal properties, according to an object based design method (this function corresponding the motion property design unit 103 and the UI interaction information unit 113), and defines the motion properties of an interaction object focused on input and output (this function corresponding to the motion property design unit 103). The model preparation unit 320 also sets shape information matching with a predetermined experiment criterion (this function corresponding to the UI shape information unit 114), defines interaction information that should be exchanged between two objects when an interaction with a user interface unit object, by using the hand (corresponding to the UI interaction information unit 113), sets the initial value of interface related to user interface usability evaluation (corresponding to the UI usability evaluation information unit 112), changes interface motion property values (this function corresponding to the motion property design unit 103), and updates the evaluation elements of internal elements of the interface (this function corresponding to the UI usability evaluation information unit 112).

The usability evaluation simulation unit 330 performs hand model simulation and MIT UI simulation focusing on the data from the modules 300 through 320, corresponding to the user interface usability evaluation unit 140. As a result, user evaluation including user interface simulation is simulated.

In short, in the hand model preparation unit 300, the usability evaluation simulation unit 330 generates and determines a hand model to be used, the model preparation unit 320 determines and generates the user interface of the product (MIT), and by using the usability evaluation units, these previous two units, the input data preparation unit for evaluation experiment 310 determines and generates input values determining the job contents to be performed in the usability evaluation simulation unit 330.

As a result, by using the input values from the input data preparation unit for evaluation experiment 310, the usability evaluation simulation unit 330 controls the motions of the models generated in the hand model preparation unit 300 and the model preparation unit 320, processes information exchange between the two models, and transfers the final evaluation value to the comparison unit 340.

The comparison unit 340 compares the evaluation result of the simulation units with a predetermined reference value determined by the simulation performer, and outputs a user interface model optimized to the give hand model and input data, that is, the utilization actions, through the optimized model output unit 350.

The hand model preparation unit 300 designs the external shape of a hand model, by using a template database for managing standardized models, or through a direct design method using a virtual human body model design tool or a 3-dimensional scanning input apparatus.

The design of characteristics of the motion of the hand model gives the characteristics of the motions to the shape of the model design by using the human model design unit 320, and this is substantially identical to the operation of the human model simulation unit 130 of FIG. 2.

The hand model preparation unit 300 designs human body anatomic parameters that will be criteria of measuring a usability evaluation experiment, designs parameters related to ergonomic analysis, designs internal constraints (for example, a disable person, lost fingers, degenerative muscle information, etc.), and designs external constraints (for example, usage of one finger, usage of one whole hand, usage of two thumbs, a case where a predetermined posture cannot be taken due to a usage environment, etc.). As a result, a function for providing motion properties to the shape of a design model is provided.

Through the hand model external shape design unit 301, an external shape is designed according to the internal and external constrains in relation to the hand of a user manipulating an object, such as the handphone described above, and with the result, characteristics with respect to the motion of the hand are designed in the hand model motion characteristic design unit 302. The hand model motion characteristic design unit 302 also operates considering the internal and external constraints of the hand of the user as described above.

In order to determine a human body model for hand based interface evaluation used in the experiment, a human body modeling unit for hand based user interface evaluation 303 sets shape information matching with a predetermined experiment criterion, such as information on the size of the hand, the length and thickness of a finger, and inputs information that a unit object of a human body model will receive according to conditions and elements having influences on a corresponding object when the human body model interacts with the UI object of the MIT. This corresponds to the function of the HM interaction information unit 133 of FIG. 2. Then, the human body modeling unit for hand based user interface evaluation 303 sets the initial value of the human body model related to usability evaluation (this function corresponding to the HM usability evaluation information unit of FIG. 2), and after receiving feedback from the user interface usability evaluation unit 140, updates the internal parameters of the human body simulation model.

A human model in a state that can be simulated through this process is determined as the shape of a human body model for hand based interface evaluation.

Since visualization of the human model simulation unit 130 can be easily implemented through a current computer graphics character animation engine technology, the hand model designed through the process described above can go through an intermediate verification process through animation output that is the motion simulation.

The operation of the input data preparation unit for evaluation experiment 310 will now be explained.

An MIT input database (DB) 311 manages data, such as predetermined contents, appropriate to the purpose of evaluating the usability of a user interface focusing on an interface utilization scenario. In order to perform design of a new interface and reevaluation of an existing interface, the interface utilization scenario may have a general purpose or a special purpose object. Even when the reevaluation of the existing interface is that for an interface apparatus in relation to different conditions, such as conditions for handling a variety of content inputs, a standardized evaluation unit is needed in order to find a comparison object or an optimum design value.

When a database is to be established, a general purpose and/or standardized database can be applied in order to compare performances of a variety of input interfaces. For example, user input words collected from a web server statistically, or the contents of national standardized documents may become a database. At this time, the method for establishing the standard test database described above is ordinary contents included in the national language processing technologies in the computer engineering field, and a skilled person in the art can easily implement this. Accordingly, detailed explanation will be omitted.

An input data processing unit for evaluation 312 selects input data appropriate to evaluation simulation from the MIT input DB 311, or by applying a random number generation technique, generates an input unit combination which is not included in the existing database so that a variety of input information items are generated. Then, unnecessary input information is filtered by considering the constraints of the hand model and the user interface model. For example, in case where an input motion of a predetermined finger is restricted by the HM motion property design unit 123 or in case where a predetermined input combination is set to be prohibited by the HM interaction information unit 133 and the UI interaction information unit 113, the input data in relation to the restriction is selectively filtered and deleted.

The input data processing unit for evaluation 312 can exchange information with the hand mode motion characteristic design unit 302 when necessary.

An input data unit for evaluation 313 divides and/or combines input data processed in the input data processing unit for evaluation 312, to fit the human body model in the usability evaluation simulation and the minimum interaction unit of the user interface model, for example, a consonant unit and a vowel unit, and provides the data to the input of the usability evaluation simulation unit 330.

The operation of the model preparation unit 320 will now be explained.

A UI external shape design/change unit 321 designs the external shape of the MIT interface which performs direction interaction with a user, by utilizing a CAD function, and performs a function practically identical to the user interface design unit 100. However, a model designed through the UI external shape design/change unit 321 is designed so that, by applying an object oriented design method, properties in relation to interaction units, for example, properties in relation to a metaphor for input such as a button and a slider, and a metaphor for output such as an image and voice, can be changed in a multi-dimensional area including spatial and temporal properties. This is identical to that properties are allowed to be changed in a multi-dimensional area including spatial and temporal properties, in the user interface prototype simulation unit 110.

A UI external shape design/change unit 321 loads a template from a database system as the user interface design unit 100 does, or can receive knowledge from the user interface design support system 101 according to design methodologies of ergonomics and design engineering, such as a random number generation technique and a cognitive interface design methodology in order to produce a design prototypes with a variety of conditions. For example, according to a design methodology of the ergonomics and industrial design engineering, the arrangement of buttons of a handphone and arrangement of a keyboard for inputting letters can be designed.

An MIT UI motion characteristic design/change unit 322 provides a motion characteristic of the MIT to the shape of a model designed in the UI external shape design/change unit 321. This corresponds to the functions of the motion property design unit 103 and the UI interaction information unit 113. More specifically, the motion property of an interaction object, for example, pushing of a power button and displaying of basic information of an LCD screen, is defined focusing on an input unit and an output unit based on the function of the MIT and an employed scenario.

An MIT UI prototype unit 323 sets shape information matching with a predetermined experiment criterion, for example, the size of a button and the arrangement interval of buttons, in order to determine an MIT UI model to be used in an experiment. This corresponds to the function of the UI shape information unit 114. Also, interaction information that should be exchanged between two objects when an interaction with a UI unit object is performed by using the hand is defined. This corresponds to the function of the UI interaction information unit 113. Also, the MIT UI prototype unit 323 sets the initial value of an interface related to the UI usability evaluation of the MIT and performs a function corresponding to that of the UI usability evaluation information unit 112. The MIT UI prototype unit 323 performs a function corresponding to that of the UI motion control unit 115, by changing the interface motion property values after receiving feedback from the user interface usability evaluation unit 140, and performs the function of the UI usability evaluation information unit 112 by updating evaluation elements of the internal elements of an interface.

The operation of the user interface usability evaluation simulation unit 330 will now be explained with reference to FIG. 4.

Figure 4:
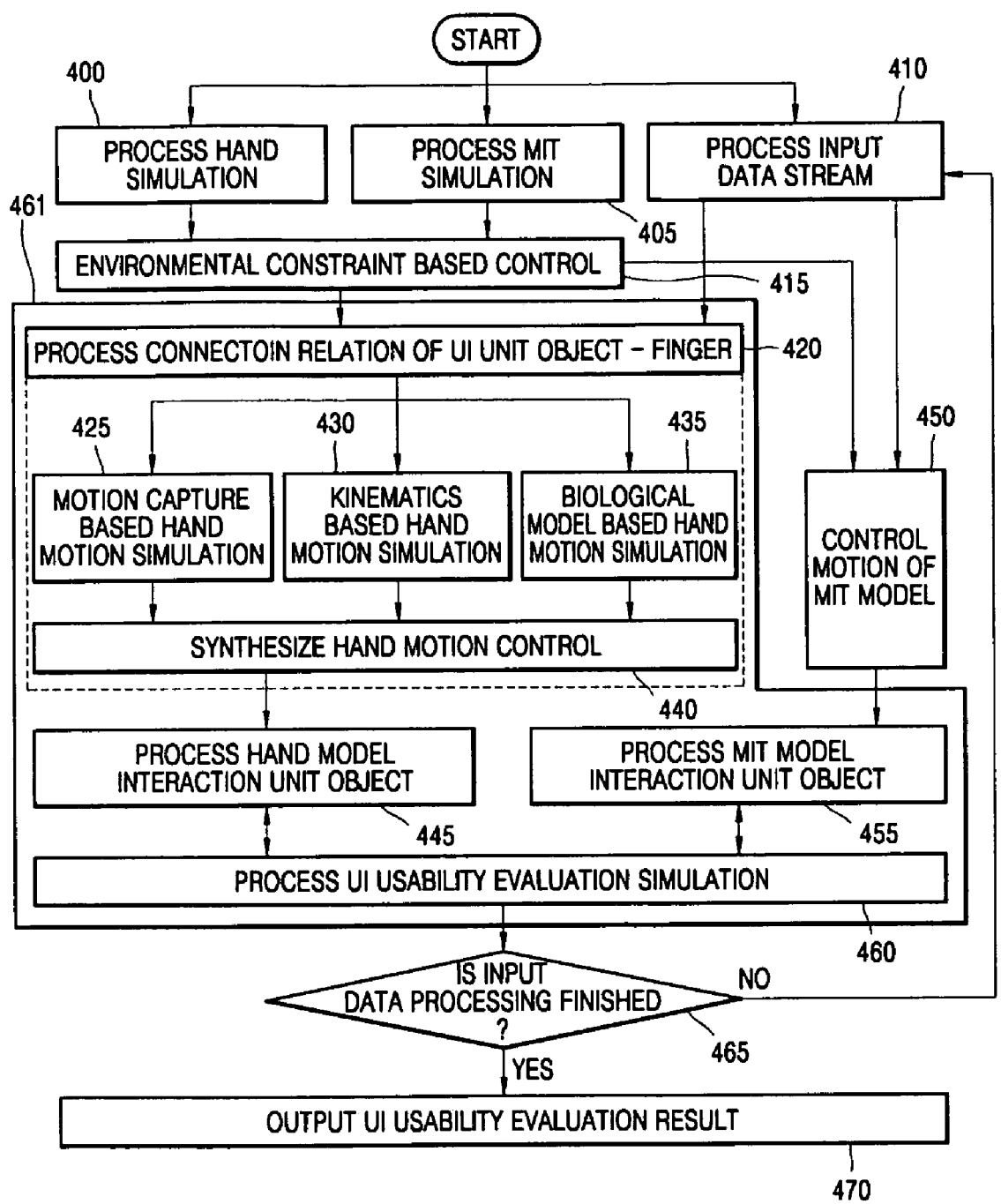
FIG. 4 is a detailed flowchart of an example of a user interface simulation in a hand interaction based user interface design and evaluation system according to the present invention.

FIG. 4 is a detailed flowchart of an example of a user interface usability simulation in a hand interaction based user interface design and evaluation system according to the present invention.

The overall structure of FIG. 4 includes the input of a data flow that is a unit of an interaction, motion simulation of a hand model and an MIT UI model corresponding to the human model simulation unit 130 and the user interface prototype simulation unit 110, and calculation of a usability evaluation score based on a currently defined design value through the motion simulation.

A given data stream for evaluation is transferred from a hand simulation processing operation 400, an MIT simulation processing operation 405, and an input data stream processing operation for evaluation 410, to the inputs of environmental constraint based control operation 415 and a UI unit object finger link relation processing operation 420.

In order to reduce a time for the MIT UI usability evaluation simulation, simulation constrains of the hand model and the MIT model and constraints defined from the input data are transferred from the environmental constraint based control operation 415 to the next operation. For the constraints, information defined from the motion property design unit 103, the HM motion property design unit 123, the UI interaction information unit 113, and the HM interaction information unit 133 can be referred to.

For example, in the hand simulation processing operation 400, constraint information of a motion that a predetermined finger cannot be used may be output and in the MIT simulation processing operation 405, constraint information that in order to use an apparatus such as the current handphone, the handphone should be gripped in a predetermined way by using the hand may be output.

In the environmental constraint based control operation 415, environmental constraint based control information according to an input condition that prohibits establishing of a link relation through mutual exchange of information between the hand model motion characteristic design unit 302 and the input data processing unit for evaluation 312, for example, a link relation that button A of the handphone should be pressed by the first finger, is generated and output to the operation 420.

In the UI unit object finger link relation processing operation 420, a link relation between a predetermined interaction unit object of the hand model, for example, a finger, and a unit object of the MIT UI model, for example, a key or a button, to process data input in the operations 410 and 415, is determined. That is, by using information in the environmental constraint based control operation, cases of a limited number of link relation combinations are generated. For example, in a simulation for manipulating 10 buttons of the MIT by using only the thumbs of two hands (two thumbs), a total of 90 combinations are available as relations to obtain a permutation value of a maximum of $_{10}P_2$. This means that 90 methods to perform operation 461 are available. In this case, if impossible postures due to constraints, such as the distance between a finger and a button and the positions of the two fingers and the MIT UI, are filtered, the number of combinations decreases.

In order to complement this processing of the link relations, major simulation operations related to determine link relations in operations 425, 430, and 435 are performed.

The three methods of determining a hand shape in the operations 425, 430, and 435 to be explained below relate to a method of changing an initial posture of a 3-dimensional model defined as a multiple joint body, to a different posture (for example, pushing a predetermined button). This can be implemented by using methods applied to solve basic problems in the character animation technology of the 3D computer graphics and the robot engineering technology field.

In the motion capture based hand motion simulation operation 425, a hand motion capture database prepared in advance is searched for a hand motion most similar to a given link relation.

In a kinematics based hand motion simulation operation 430, for example, the motion of the hand model defined as a multiple joint body is determined by using an inverse kinematics (IK) and/or dynamics of the robot engineering in a situation arranging two objects in a space, in which position information of the hand or finger and the button of the MIT apparatus in the 3-dimensional space is determined in the operations 410 and 415.

In a biological model based hand motion simulation operation 435, more realistic motions of the hand model are simulated, by using a human body anatomy modeling technique based on a movement analysis theory (for example, a biomechanical simulation) and a non-rigid body modeling technique (for example, a visualization method used in a computer graphics field in order to enhance visually realistic feeling).

In a hand motion control synthesis processing operation 440, motion information of the hand model generated in the previous 3 simulation operations is synthesized into one resulting hand shape, by using priority and synthesis ratio information. At this time, when necessary, an administrator determines the priority and synthesis ratio information in the generated motion information of the hand model.

Here, for example, the contents of the hand motion determined in the operations 425, 430, and 435, such as "whether or not the end of a finger exactly corresponds to a button" and "whether or not the hand motion given as the result is excessive", are determined in operation 440. At this time, an expert who is the administrator can select and determine the contents, by visualizing the results of the operations 425, 430, and 435 as a 3D graphic, or the determination can be performed based on resulting figures obtained through the hand simulation processing such as the operation 400. Also, a synthesis processing method, such as a hybrid method, giving weighted ratio to each simulation of the operations 425, 430, and 435, (for example, giving priorities and weights of (0.5× result of operation 425)+(0.3×result of operation 430)+(0.2× result of operation 435)) can be used. This is a generalized method referred to as motion data editing/blending in a motion information synthesis research field.

In a hand model interaction unit object processing operation 445, usability evaluation related interaction information calculated from the hand model output from the human model simulation unit 130 is processed, while the hand model is performing the hand model control synthesis processing operation 440. In the hand model interaction unit object processing operation 445, the human model simulation unit 130 updates information occurring in each of the simulation operations 425, 430, and 435 of FIG. 4. For this, the bi-directional communication path of the evaluation simulation communication unit 147 of FIG. 2 is used.

In an MIT model motion control operation 450, the motion of the MIT model is performed according to information input from the environmental constraint based control operation 415 and the input data stream processing operation 410. In the operation 461, the MIT model motion control operation 450 is a process for processing the motion of the device itself, because the model preparation unit 320 determines before the operation 410, for example, which button should be processed in the aspect of mechanical apparatus of the handphone while a simulation to find the relation between a finger and a predetermined button of the handphone.

In an MIT model interaction unit object processing operation 455, while the MIT model performs the motion given in the MIT model motion control operation 450, usability evaluation related interaction information, which is calculated from the MIT model that is the result of the user interface prototype simulation unit 110, is processed. Here, by using the bi-directional communication of the evaluation simulation communication unit 147 of FIG. 2, information is processed from the viewpoint of a mechanical apparatus that is the handphone, not of a human (hand).

In a UI usability evaluation simulation processing operation 460, communication between the user interface prototype simulation unit 110 and the human model simulation unit 130 performing the operations 445 and 455 is controlled, and the processing result is stored. Also, the communication between the hand model simulation and the MIT UI simulation included the MIT UI usability evaluation simulation unit 330 can be an object of the control. In this case, the communication control means control of execution of the information exchanging process between two simulation operations, by a method of multi-processing, multi-threading, or inter process communication (IPC).

In an operation 460 for determining whether or not input data processing is finished, if the given input stream is all processed, a UI usability evaluation result output operation 470 in which the usability evaluation result included in the current design setting value is processed and output, is performed.

Since hand shapes for a variety of cases in relation to an interaction event that is one unit input can be determined, the operation 461 that includes operations from the operation 420 for determining the link relation of a UI unit object and a finger, to the operation 460 for finishing a test for a determined combination, can use a parallel processing simulation technique to perform the operations in order to reduce the execution time.

More specifically, the operations 425, 430, and 435 can be processed in parallel and the operations 445 and 455 can be processed in parallel. Since each of these is a process for solving a variety of combinations of problems with identical program structures as a whole, parallelism can be used for the implementations.

If the evaluation result that is the result of the simulation is output and the result of the usability evaluation is greater than a predetermined reference value or threshold value, the comparison unit 340 transfers an optimum UI design that is the result of the above processes, to the optimized model output unit 350 so that the result can be output.

If the result is not greater than the predetermined criterion, the comparison unit 340 notifies this to the MIT UI external shape design/change unit 321, and changes the determination criterion through dialogue-type communication using the user interface prototype simulation unit 110 or the user interface design unit 100, or based on a predetermined optimization algorithm, changes the current UI design and performs simulation again.

FIG. 5 is a flowchart of an example of design and evaluation of a user interface of a mobile terminal according to the present invention. The explanations of FIGS. 1 through 4 according to the present invention are shown in the single diagram of FIG. 5.

In a hand model generation operation 500, a virtual hand model that can be used in a usability evaluation simulation is generated. In order to support simulations with a variety of users' conditions, a database of hand models is established.

In order to generate a 3-dimensional hand model, skin organization that is the external shape of the 3-dimensional model is generated by using commercial 3D CAD systems, such as Maya, and 3D Studio Max, and the internal structure to control the motion of the external shape can be designed as a bone and joint structure based on data of the human body anatomy and movement analysis theory. The shape is the same as that expressed with links and joints that are basic in a robot design in the robot engineering.

At this time, in order to implement more accurate human motion simulation and visualization of skin deformation, and to calculate usability indices such as calculation of a fatigue degree, a muscle and muscular fiber link structure can be added to the internal and external structures generated as described above. In this case, a deformable mesh control technique can be used for the human motion simulation and the visualization of skin deformation.

In order to define the basic structure with a template for the hand model and to support a variety of users' cases, human body statistical data which is used for generation of an experimentee model in the ergonomics field can be loaded and reflected. That is, since the 3-dimensional hand model designed as described above, has basically numerical data of 3-dimension values (x, y, z values), the hand model can be transformed into one having an arbitrary length and volume, by using a 3-dimensional transformation in the computer graphics field.

In addition to the method of establishing a model database by using conventional numerical data of a human body, a method by which a virtual hand model of a user directly participating on the spot is generated, can also be supported. That is, user's skin image (texture) image and dimension information of the hand are extracted through a 2-dimensional image taking with a computer vision technique, and then synthesized with the basic hand template model designed as described above, or by using a 3-dimensional scan technique, a model matching with the hand of the user, a skin model (polygon mesh) and a skin image (texture) model are obtained.

In a hand model motion characteristic design operation 502, realistic motions of the hand are designed. The realistic motion of the hand model are generated by adding information on interactions of muscles and tendons based on the movement analysis theory, as well as applying only the kinematics and dynamics of the robot engineering to the motion control structure of the hand formed with bones and joints.

That is, the angle of each joint has a predetermined range in which the joint can move, and when one finger moves, there are other fingers being affected by the motion of the finger. Accordingly, by using this information, the realistic motions of the hand are generated. Then, physical data (for example, length, volume, density, elasticity, etc.) of the hand model elements (bones, muscles, muscular fiber, skin, joints) are set and used as parameters for interpreting a motion.

In a hand model determination operation for evaluation experiment 504, a hand model to be used finally in each simulation is determined. The hand model is obtained by selecting it in the model database generated in the operation 500 or by applying a computer vision based measuring method to obtain the dimensions of the current user's body, and this model is applied to a template models through a 3-dimensional model transformation technique. Also, random shape data is generated assuming an arbitrary user, and then the obtained value can be applied.

Also, in relation to an interaction object at a lower layer forming the hand model (for example, one knuckle), the numbers defined in the movement analysis characteristic setting are changed through the hand model motion characteristic design operation 502. For example, based on the movement analysis information of the hand, the range in which each finger can move, can be changed according to the experiment purpose. That is, in a situation where some fingers cannot be used according to the using method of the MIT device used for the experiment (for example, when the handphone is held by one hand, only the thumb can be used for buttons on the top half of the keypad and only the index finger and middle finger can be used for buttons of the side surface of the handphone), the range can be changed. Then, the magnitude of a force applied to the hand model itself and an interaction unit object of an external user interface object, for example, a predetermined button in an entire information terminal, is determined.

After the hand model is selected, parameters related to the usability experiment are set. The usability experiment related parameters are a subject of an experimentee test technique in the ergonomics and industrial engineering fields, and a variety of measurement elements occurring when a user interface using the hand is used, for example, work load and a fatigue degree value, and a preference degree value of a user of a predetermined design trend are set.

The hand model for simulation is prepared through the operations 500, 502, and 504 described above and the hand model generation operation 500 can be omitted if the model database has been already established.

In a database generation operation for evaluation data 508, a database of input data for usability evaluation is established. A user interface designed for a general or special situation has the contents of jobs appropriate to a scenario corresponding to the interface, and needs a standardized test for comparison and evaluation among a variety of interface designs. In the general situation, for example, usability of handphone key button design can be evaluated with taking ordinary people as objects. In the special situation, for example, usability evaluation in relation to a handphone for disabled persons, and usability of a UI design of a mobile apparatus appropriate to a specific work (construction site, workshop, and equipment repair, etc.) can be performed. As an example of an interface apparatus for a special situation, a special apparatus, such as a wearable computer, not an ordinary PC, is needed by a user whose job is maintenance and repair of complicated electronic and mechanical systems, such as an airplane repair person. Since an ordinary user interface, such as a mouse and a keyboard used in an ordinary desktop computer, cannot be used in this special apparatus, it is regarded as a special situation.

When a new interface apparatus is newly developed, for example, there should be a publicly certified comparison evaluation result in order to support an argument, "this apparatus has a better usability than that of the conventional apparatus." In some cases, standardization of input data for experiments is set up among researchers or by an international certification body, and this can be used as a standardized test for comparison evaluation. When there is no separate international standard, comparison evaluation can be performed based on the contents published on a web site well known to the field of the art, for example, Google.

Accordingly, in the operation 508, major key words and sentences are collected in the form of a database through a natural language processing techniques, from the data such as documents for living, including a dictionary used by ordinary people, and a variety of forms of public organizations, and textbooks. For example, in case of a computer user interface, collection and statistical data can be obtained through log file information recording contents transferred to a web server through an input window of an Internet web browser. In case of a mobile information terminal (for example, message service of a handphone), input data frequently used by a current user can be used as reference data for determining a control sequence of a user interface object (for example, buttons), by utilizing log file information of a server processing the service.

In an input data selection operation for evaluation 510, a set of data appropriate to a current usability simulation condition is selected from the database established in the operation 508. That is, when button input is performed with one thumb and according to a method based on the purpose of usability evaluation and the preference (for example, a set of input data mainly used by those who are in their 20s), the types of letter unit that can be input by one input motion are limited by the number of the buttons. Also, if a predetermined finger is lost, a predetermined input mode of a currently given user interface cannot be used. In these cases, usage constraints of a predetermined hand part and the MIT UI constraints are applied to select a set of data. Also, a set of data can be selected by using a method for generating a random input data set at a grapheme unit level in the currently establish input data.

In the hand model motion characteristic operation 502 and the input data selection operation for evaluation 510, information can be changed between the operations, and this corresponds to the information exchange between the hand model preparation unit 300 and the input data preparation unit for evaluation experiment 310.

In an input data determination operation for evaluation 512, the contents of the set of input data selected in the operation 510 are divided into minimum manipulation units of the interaction unit object (for example, one button) of the MIT UI, and this divided result is arranged in one stream and transferred to the input of an input data stream processing operation 514.

The input data for evaluation is prepared through the three operations 508, 510 and 512, and the DB generation operation for evaluation data 508 can be omitted if the database has been already established.

In an MIT model design/change operation 516, the external shape of the MIT model focusing on the UI is generated by an ordinary method. A new MIT can be designed by using information of a model data established by the conventional CAD system normally used, or by using a CAD tool and a knowledge-based database technique.

In an MIT motion characteristic design/change operation 518, the basic structure of the MIT model is designed and changed in order to support usability simulation. This is performed, by setting the motion of the MIT UI in relation to an external input action, such as pushing a button, and the interaction relation between the MIT UI unit objects following the motion. This setting can be executed through a process in a CAD tool, for providing an activity property to an object and designing information to be expressed in a virtual LCD window following a button input.

In an MIT UI prototype setting/change operation for evaluation experiment 520, shape information setting values of a UI element are changed, or interaction parameter values for performing a simulation, such as the amounts of impact and absorption of a UI unit object, are set, or consumer's preference degree information in relation to a design element is set, so that the values can be used as supporting data in the feedback operation of the usability evaluation process.

Through the three operations 516, 518, and 520, the MIT UI model for simulation is prepared. The MIT model design/change operation 516 can be omitted if the model database has been already established.

In an input data stream processing operation 514, the arranged input data is transmitted to an MIT model motion control operation 524, so that the MIT model simulation is determined by determining the operation method of the MIT UI object. The arrange input data is also transmitted to a UI unit object-finger link relation processing operation 528 so that a simulation of the hand model determining, for example, a button to be pressed and a finger to be used, is determined.

In an environmental constraint based control operation 526, constraints from the hand model prepared through the hand model preparation operation for simulation 506 and the MIT UI model prepared in the MIT UI model operation for simulation 522, are combined and transferred to the next operation, the UI unit object-finger link processing operation 528, so that the number of combinations can be limited. For example, when only two thumbs are used, processing of link relations among the remaining fingers is not performed.

In the UI unit object-finger link relation processing operation 528, link relations between n minimum interaction unit objects (for example, finger ends) of the hand simulation model and m minimum interaction unit objects (for example, buttons) of the MIT UI simulation model provided from the previous operation are defined. The UI unit object-finger link relation processing operation 528 receives inputs from the environment constraint based control operation 526 and the input data stream processing operation 514, and this is the same as described above with reference to operations 415, 420, and 410 in FIG. 4.

In this operation 528, in defining a variety of link relations by permutations and combinations, the order of minimum interaction unit objects is determined according to the order that the data is input sequentially as the output of the input data stream processing operation 514. That is, the order of the minimum interaction unit objects is determined according to the order of input. For example, in case of a word "emergency" as an input data stream, the specific input contents at the time of performing the usability evaluation simulation are input as "e m e r g e n c y", and corresponding to this order, the order of a variety of combinations of the ends of fingers that are the minimum interaction means and one key button is determined.

For example, when a handphone is manipulated, a button of the handphone to be pressed and a finger to be used for that are determined in the UI unit object-finger link relation processing operation 528.

In a hand motion/shape simulation operation 530, according to the link relation of two interaction objects determined in the UI unit object-finger link relation processing operation 528, the shape (posture) of the hand model is transformed. In case of the hand model having a multiple joint structure, a motion control method used in the 3D computer graphics and robot engineering is used. That is, by using hand motion data recorded in advance or a virtual reality apparatus, such as Cyberglove of Immersion, the value of each joint is read from the posture of the hand which is input in real time, and is used as data for model transformation. Also, a motion taking an arbitrary posture can be calculated and generated by considering the kinematics and dynamics. In addition, in order to perform a simulation of a more realistic hand shape, the movement analysis theory and biomechanical model can be applied so that a process for correcting detailed postures can be performed.

In a hand motion control synthesis processing operation 532, the motion process that is the changes of the hand shapes determined according to the three motion control methods in the operation 530 is generated as transformation information of the hand model from the initial position (time=0) to the final (contact) position (time=n), that is, as a real time 3D animation. The determination of one final value from the result obtained through the three control methods is performed, by providing priorities and weights to the three motion control methods, respectively, according to inputs of a system operator, so that the results can be unified into one value. For example, when a model is controlled with using motion capture data being input through an interface apparatus at the time of performing a simulation, most of control values are made to be based on the captured motion data, and in order to solve a position correction problem caused by error values of the interface apparatus at a final position value and the like, the correction is performed by using a method, such as a joint angle calculation method based on the kinematics.

For example, when a handphone is manipulated, the shape of the hand to be used for the manipulation is determined in the hand motion control synthesis processing operation 532.

As shown in FIG. 5, the MIT model interaction unit is processed, and the hand model interaction unit object is processed. Also, through the processing of the UI usability evaluation simulation, and through the communication process among the UI motion control unit 115 of the user interface prototype simulation unit 110, the user interface usability evaluation unit 140, and the HM motion control unit 135 of the human model simulation unit 130 of FIG. 2, the motion change of the MIT UI model is controlled (for example, visualization of pressing a button), and interaction information and usability evaluation information at the time when a motion occurs are exchanged.

This can be explained in brief as the following.

In relation to the processing of the MIT model interaction unit object and the processing of the hand model interaction unit object, the information exchange situation occurring among the user interface prototype simulation unit 110, the human model simulation unit 130, and the user interface usability evaluation unit 140 of FIGS. 1 and 2 is obtained by generalizing all situations that should occur in a predetermined button that is an interaction unit object in a handphone, for example, when an action (of pressing the button) by a finger is performed.

The processing of the UI usability evaluation simulation is processing of communication between the user interface usability evaluation unit 140, the user interface prototype simulation unit 110 and the human model simulation unit 130. By referring to or updating the information of the UI usability evaluation information unit 112 and the HM usability evaluation information unit 132, whether or not determination of the usability evaluation values, such as the physical fatigue degree occurring in the UI part, work load, or motion control of the human model was easy through the usability evaluation experiment, or whether or not generation of a variety of motions was impossible because of various motion constraints occurred, or whether or not the final result obtained through the generation of a series of hand motions put a lot of work load on the joint of the hand is calculated and processed.

An MIT model interaction unit object processing operation 537 is identical to the MIT model interaction unit object processing operation 455 of FIG. 4, and a UI usability evaluation simulation processing operation 536 is identical to the UI usability evaluation simulation processing operation 460 of FIG. 4, and explanation of these operations will be omitted.

In an operation for completing a current MIT model usability evaluation 538, if the usability simulation result of the current setting is equal to or less than a threshold value, the MIT model design/change operation 516 is performed for optimization, as in the comparison unit 340 of FIG. 3. However, if the usability simulation result of the current setting is greater than the threshold value, the optimized UI design and evaluation result output unit 145 and the optimized result animation generation unit 146 are operated as in the operation of the optimization model output unit 350 of FIG. 3.

For the animation generation function, the operations from the hand model preparation operation for simulation 506, the input data stream processing operation 514, and the MIT UI model operation for simulation 522, to the UI usability evaluation simulation processing operation 536 are performed again and a moving picture recording method is applied so that the result can be used as data for demonstration and education. As a result, only one case in which the number of combinations in the UI unit object-finger link relation processing operation 528 is optimized is selected, such that fast generation of a result is enabled. The reason why the operations from the UI unit object-finger link relation processing operation 528 and the MIT model motion control operation 524 to the UI usability evaluation simulation processing operation 536 are bound by dotted lines is to indicate a part that can be processed in parallel (corresponding to 461 of FIG. 4). By using the part that can be processed in parallel, when simulation of the human model and the user interface model is performed with given input conditions, a variety of cases of the UI unit object-finger link relation processing operation 528 can be executed independently by using a multi-threading technique of the computer programming technique field, such that the entire time for usability simulation can be reduced.

The MIT model interaction unit object processing operation 537 is identical to the MIT model interaction unit object processing operation 455 of FIG. 4.

As described above, the present invention uses an active computer simulation, and considers combinations (group 1) of a variety environmental constraints defined in the user interface development and a variety of types of user interface designs, and combinations (group 2) of the physical and/or mental characteristic and/or constraints of a user and a variety of motions and/or postures of the user that can be performed in order to generate one result and/or event. Then, in the complicated link relations between the two groups 1 and 2, an optimum solution is identified focusing on physical convenience and work performance improvement.

Also, according to the present invention, in the design of a 3-dimensional virtual user interface, including graphic user interface (GUI), to express interaction units for input and output functions of a system, usability evaluation and simulation in relation to a virtual user interface considering the environmental conditions in which the result will be used can be performed for interaction with a virtual user interface, before development of a physical interface apparatus (for example, tracking apparatus for the hand/head/eyes).

Accordingly, in the design of a physical interaction based user interface, the present invention simulates the relations based on the interactions with an external model (interface apparatus) of a human body model, with the active actions of the human body model, and strengthens and automates the usability evaluation as a quantitative system. By doing so, the present invention provides the effect inducing development of an optimum user interface with an economic efficiency higher than that of the passive design evaluation system using experimentees.

While the present invention has been particularly shown and described with reference to exemplary embodiments thereof, it will be understood by those of ordinary skill in the art that various changes in form and details may be made therein without departing from the spirit and scope of the present invention as defined by the following claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

Also, it is easily understood by those skilled in the art that each step of the present invention can be implemented in a variety of ways, including by software and hardware.

Each operation of the present invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

According to the present invention, the user interface design and evaluation system includes a user interface design unit, a human model interaction design unit, a user interface prototype simulation unit, a human model simulation unit, and a user interface evaluation unit. In order to develop a user interface in consideration of usability of a user, the system provides a usability evaluation feedback system performing optimization of an interface design based on a motion simulation of a body model and user interface model.

Through this, an optimum interface design is induced and by reducing the initial usage difficulty of the new interface for a user, the user can easily use the new interface and work performance of the user can be enhanced. In addition, by supporting fast prototyping and evaluation in a new product development stage, efficient production of a product having a short life cycle can be actively implemented.

Also, by using the UI and HM simulation techniques, the present invention can provide specific demonstration information in relation to UI usage, to users, such that it can be utilized in the education and training fields.

The system according to the present invention is based on a method deriving an optimum interface design in terms of the usability evaluation criterion, from interface usage in the form of interaction with direct or physical contact using activities of a human body, or from interface usage in the form of indirect interaction through analysis of biological and/or physical information collected through an arbitrary sensor. Accordingly, the system can be used in the development of physical interfaces such as design of a keyboard and a keypad of an information terminal, and in the development of virtual interfaces such as design of a virtual keyboard and a 3D space menu.

The result according to the present invention can be applied to user interface development fields, in which physical interaction is performed through a variety of physical motions, from development of shapes and arrangement methods of a keypad for a small-sized information terminal, and development of a new keyboard and input and output apparatuses for consumer electronic products, to development of an instrument board of the cockpit of an airplane.

Also, the result according to the present invention helps to find an optimum method linking the result of physical actions of a user in relation to a 3D space, with the function of an interface system, as in the development of a virtual user interface that can be used in a mobile information terminal (MIT) in a next-generation wearable form. By doing so, the result can be applied to a field to support effective interaction with an arbitrary application. Furthermore, by interpreting biological information or physical action information as command event information, the result of the present invention can be applied to a design field for a feedback interface which helps user's expression of a command when an interaction with a unit interface object is performed indirectly.

In addition, the result of the present invention can be applied to a user interface development process in a general case, such as information, consumer electronics, military applications, and entertainment applications, in which interaction between a user and a system occurs. That is, before a subject usability test stage which is performed in a series of user interface development processes, by using an automated computer simulation, an optimum result is derived in a short period such that gains can be obtained in terms of time and cost.

What is claimed is:

1. A user interface design and evaluation system based on interaction, comprising:
    a user interface design unit designing a user interface having user interface objects, and providing a motion property to each unit object;
    a user interface prototype simulation unit managing interaction information defining the interaction between an internal object of the user interface and the outside, and managing information related to a usability evaluation, and performing simulation of the designed user interface, wherein the information related to the usability evaluation is information related to the usability of the user interface by a user;
    a human model design unit designing a human model in relation to a human body to be evaluated when determining the usability of the user interface, and authoring a motion characteristic model of the designed human model;
    a human model simulation unit managing information at a time when the human model interacts with objects of the user interface, and performing simulation of the designed human model; and
    a user interface usability evaluation unit managing contents-based input data that are the contents of a usability evaluation experiment for evaluating the usability of the user interface by a user using the generated user interface and human model, wherein the user interface usability evaluation unit uses the simulated result of the user interface and the simulated result of the human model to perform a usability evaluation experiment of the user interface in relation to the human model and evaluating the usability of the designed user interface to assign an evaluation result value of the usability evaluation experiment for determining an optimum user interface.

2. The system of claim 1, wherein the user interface design unit supports design of objects of the user interface, and by using an available input and output interface tool, designs a 2-dimensional and/or 3-dimensional user interface and provides a motion property to each of the unit objects.

3. The system of claim 2, wherein the user interface design unit simulates the motion of a designed user interface according to a predetermined method, and verifies a designed model.

4. The system of claim 1, wherein the user interface prototype simulation unit modifies shape information that is physical data of a user interface design;
- manages interaction information to be exchanged by the internal object of the user interface with the outside, when an external object, including a human body, interacts with an object of the user interface;
- sets initial values of the user interface, including the position of an object, in relation to the usability evaluation;
- receives feedback data including evaluation information of the initial values of the user interface from the user interface usability evaluation unit to provide reference information for changing the structure of the user interface;
- updates evaluation elements of internal objects of the user interface; and
- performs simulation by linking model data defined in the user interface design unit, the user interface shape information, the user interface interaction information, and the usability evaluation information of the user interface.

5. The system of claim 1, wherein the human model design unit supports design of a basic human body model of a human being by forming and displaying a human body using graphic data;
- designs a human body model for a user interface usability evaluation experiment;
- authors a motion characteristic model of the designed human body model according to a human body anatomy and a movement analysis theory; and
- simulates the motion of the designed human body model and verifies the designed model, by using motion data of a normal human body, or using motion data of a state in which predetermined constraints are added, or generating arbitrary motion data.

6. The system of claim 1, wherein the human model simulation unit changes, when necessary, the shape information of the human body model whose design is completed in the human model design unit;
- authoring information items which is includes information of the human body models interaction with the objects of the user interface including the effect interaction with the objects of the user interface has on the human model;
- sets initial values of the human body model, including tendencies of a user, in relation to the usability evaluation;
- receives feedback data, including evaluation information of the initial values of the human body model, to update internal parameters of a human body simulation model; and
- performs simulation by linking model data defined in the human model design unit with human model shape information, human model interaction information and the human model usability evaluation information.

7. The system of claim 1, wherein the user interface usability evaluation unit manages contents-based input data that are the contents of a usability evaluation experiment using the generated user interface model and human model;
- divides data selected from the input data into units appropriate to a usability evaluation experiment operation, and provides the divided data to the user interface prototype simulation unit;
- evaluates usability of the user interface model by a user, by processing a usability evaluation experiment using the selected input data, the simulation result of the user interface prototype simulation unit, and the simulation result of the human model simulation unit; and
- sets relations for exchanging interaction information designed in the user interface prototype simulation unit and the human model simulation unit.

8. The system of claim 7, wherein the user interface usability evaluation unit outputs to a user, the result of an optimum user interface design in relation to the human body model obtained by processing the resulting values of the evaluation experiment; and
- together with the optimized user interface design result, outputs moving pictures of a situation in which the user interface is used by the body model.

9. The system of claim 1, wherein the user interface prototype simulation unit exchanges predetermined feedback data information with the user interface usability evaluation unit.

10. The system of claim 1, wherein the human model simulation unit exchanges predetermined feedback data information with the user interface usability evaluation unit.

11. A user interface design and evaluation system based on hand interaction, comprising:
- a hand model preparation unit designing human body anatomical parameters that are measuring criteria of a usability evaluation experiment, designing parameters related to an ergonomic analysis, designing internal constraints, and designing external constraints, and providing motion characteristics to the shape of a designed hand model, wherein the usability evaluation experiment determines the usability of a user interface by a user;
- an input data preparation unit for a usability evaluation experiment, the Input data preparation unit managing a database for evaluating the usability of a user interface model by a user, and providing input data to be used in usability evaluation simulation, from the database;
- a model preparation unit designing a user interface model by designing the external shape of an interface performing direct interaction with a user, and determining interaction of a unit object of the user interface model and a unit object of the hand model to define interaction information to be exchanged between the two objects, changing the motion property value of the user interface model, and updating evaluation elements of the internal element of the user interface model; and
- a usability evaluation simulation unit performing the usability evaluation experiment the usability evaluation simulation unit controlling the simulation of the hand model and the user interface model, and evaluating the usability of the hand model by a user by using the resulting data from the hand model preparation unit, the input data preparation unit, and the model preparation unit, and obtaining an evaluation result value based on the evaluation for determining an optimum user interface.

12. The system of claim 11, further comprising:
- a comparison unit comparing the usability evaluation result value of the usability evaluation simulation unit with a predetermined reference value,
- wherein if the usability evaluation result value is not greater than the reference value in the comparison unit, the comparison unit notifies the model preparation unit and the external shape of the user interface is designed again.

13. The system of claim 11, wherein the input data preparation unit for a usability evaluation experiment manages a database appropriate for evaluating the usability of a user interface by a user by focusing on a predetermined utilization scenario;

generates input information items by selecting input data appropriate for the usability evaluation simulation from the database, or by generating a random numbers; and provides the input data to the usability evaluation simulation unit after dividing and/or combining the input data so that the input data corresponds to a minimum interaction unit of a human model and a user interface model to be used in the usability evaluation simulation.

14. The system of claim 11, wherein the model preparation unit designs the external shape of the interface directly through interaction with the user;

allows the properties of the designed user interface model in relation to an interaction unit object to be changed in a multi-dimensional area, including spatial and temporal properties, according to an object based design method;

defines the motion property of an interaction object, focusing on input and output;

sets shape information matching with a predetermined experiment criterion;

defines interaction information to be exchanged between objects when an interaction between a unit object of the user interface model and an object of the hand model is performed;

sets the initial values of a user interface model related to the evaluation of the usability of the user interface model by a user;

changes interface motion property values in response to feedback received from the user interface usability evaluation unit; and updates evaluation elements of internal elements of the interface.

* * * * *